US007523368B2

(12) United States Patent
Jaworski et al.

(10) Patent No.: US 7,523,368 B2
(45) Date of Patent: Apr. 21, 2009

(54) DIAGNOSTICS UNIT USING BOUNDARY SCAN TECHNIQUES FOR VEHICLES

(75) Inventors: Douglas S. Jaworski, St. Petersburg, FL (US); Daniel W. Snider, Tampa, FL (US)

(73) Assignee: Honeywell International Inc., Morristown, NJ (US)

( * ) Notice: Subject to any disclaimer, the term of this patent is extended or adjusted under 35 U.S.C. 154(b) by 640 days.

(21) Appl. No.: 11/340,390

(22) Filed: Jan. 26, 2006

(65) Prior Publication Data

US 2007/0174749 A1 Jul. 26, 2007

(51) Int. Cl.
*G01R 31/28* (2006.01)
*G01F 11/00* (2006.01)

(52) U.S. Cl. ........................................ 714/724; 714/30

(58) Field of Classification Search ....................... None
See application file for complete search history.

(56) References Cited

U.S. PATENT DOCUMENTS 5,243,273 A * 9/1993 McAuliffe et al. .......... 714/724
5,659,552 A 8/1997 Ke et al.
5,841,788 A 11/1998 Ke
6,161,205 A 12/2000 Tuttle
6,195,772 B1 * 2/2001 Mielke et al. ............... 714/724
6,363,510 B1 3/2002 Rhodes et al.
6,433,569 B1 8/2002 Eliashberg et al.
6,521,312 B1 2/2003 Keiser
6,900,650 B1 5/2005 Sheng et al.
6,910,162 B2 6/2005 Co et al.
6,966,018 B2 * 11/2005 Hilliges ...................... 714/724
7,111,211 B1 9/2006 Co et al.
7,265,556 B2 9/2007 Van Treuren et al.
2003/0229835 A1 12/2003 Whetsel
2006/0242511 A1 10/2006 Whetsel
2007/0136631 A1 6/2007 Govani et al.
2007/0300109 A1 12/2007 Whetsel

* cited by examiner

*Primary Examiner*—Christine T Tu
(74) *Attorney, Agent, or Firm*—Fogg & Powers LLC

(57) ABSTRACT

A test system including a diagnostics unit comprising a plurality of diagnostics-unit interfaces to communicatively couple the diagnostic unit to a plurality of units under test and a unit diagnostic communication port via which a unit diagnostic control device is communicatively coupled to the diagnostics unit. Each unit under test includes a module bridge interface and boundary-scan test functionality. When the module bridge interface of each of the units under test is communicatively coupled to a respective one of the plurality of the diagnostics unit interfaces, the boundary-scan test functionality of the respective unit under test is communicatively coupled to the unit diagnostic communication port in order to communicate with the unit diagnostic control device when the unit diagnostic control device is communicatively coupled to the diagnostics unit.

22 Claims, 5 Drawing Sheets

DIAGNOSTICS UNIT USING BOUNDARY SCAN TECHNIQUES FOR VEHICLES

This application is related to U.S. patent application Ser. No. 11/340,286 having a title of "METHOD AND SYSTEM FOR BACKPLANE TESTING USING GENERIC BOUNDARY-SCAN UNITS" and U.S. patent application Ser. No. 11/340,295 having a title of "BOUNDARY-SCAN SYSTEM ARCHITECTURE FOR REMOTE ENVIRONMENTAL TESTING" both of which are filed on the same date herewith. The application are hereby incorporated herein by reference.

BACKGROUND

Some devices and/or systems collect data in remote and/or physically inaccessible environments and transmit the data to receiving stations in accessible environments. For example, scientists in receiving stations retrieve data from unmanned underwater vehicles (also referred to here as a "vehicle") located miles under the ocean or from space vehicles orbiting above the atmosphere of the earth (also referred to here as a "vehicle" or an "airborne vehicle"). If a portion of the devices or systems (also collectively referred to here as "units under test" and individually as a "unit under test") fails while in the inaccessible environment, it is not possible for an operator to locally test with a probe, examine and/or replace any failed unit under test or any portion thereof.

In some cases, the inaccessible devices and/or systems include redundant systems, where a secondary or "backup" device or system is activated in order to replace a failed "primary" device or system. Additionally in some cases, software (or other programmable devices) in the inaccessible devices and/or systems is re-programmable. In that case, the software is reprogrammed to avoid using the defective devices and/or systems while the overall system remains operational. In either of these cases, an operator in the receiving station must know which component and/or components have failed in order to take the corrective action. In this situation, it is necessary to diagnose the problem remotely since it is not possible to locally probe, examine and/or replace any failed parts of the unit under test.

SUMMARY

A first aspect of the present invention provides a test system including a diagnostics unit comprising a plurality of diagnostics-unit interfaces to communicatively couple the diagnostic unit to a plurality of units under test and a unit diagnostic communication port via which a unit diagnostic control device is communicatively coupled to the diagnostics unit. Each unit under test includes a module bridge interface and boundary-scan test functionality. When the module bridge interface of each of the units under test is communicatively coupled to a respective one of the plurality of the diagnostics unit interfaces, the boundary-scan test functionality of the respective unit under test is communicatively coupled to the unit diagnostic communication port in order to communicate with the unit diagnostic control device when the unit diagnostic control device is communicatively coupled to the diagnostics unit.

A second aspect of the present invention provides a vehicular test system comprising a vehicle, a test system enclosed within the vehicle and a receiving station external to the vehicle. The test system is communicatively coupled to the receiving station via a unit diagnostic control device. The test system comprises a diagnostics unit including a plurality of diagnostics unit interfaces to communicatively couple the diagnostics unit to the plurality of units under test, and a unit diagnostic communication port via which a unit diagnostic control device is communicatively coupled to the diagnostics unit. Each unit under test includes a module bridge interface and boundary-scan test functionality. When the module bridge interface of each of the units under test is communicatively coupled to a respective one of the plurality of the diagnostics unit interfaces, the boundary-scan test functionality of the respective unit under test is communicatively coupled to the unit diagnostic control device via the unit diagnostic communication port when the unit diagnostic control device is communicatively coupled to the unit diagnostic communication port.

A third aspect of the present invention provides a method comprising communicatively coupling a unit diagnostic communication port of a diagnostics unit in a vehicle to a unit diagnostic control device in the vehicle, communicatively coupling boundary-scan test functionality included on at least one unit under test to the unit diagnostic communication port, communicatively coupling the boundary-scan test functionality included on the at least one of the unit under test to the unit diagnostic control device via the diagnostics unit; and communicating data between the unit diagnostic control device and the boundary-scan test functionality included on the at least one unit under test in order to test at least a portion of the at least one unit under test.

A fourth aspect of the present invention provides a method comprising communicatively coupling a unit diagnostic communication port of a non-critical diagnostics unit in an airborne vehicle to a unit diagnostic control device in the airborne vehicle, communicatively coupling at least one unit under test to the diagnostics unit, communicatively coupling boundary-scan test functionality included on each unit under test to the unit diagnostic communication port, communicatively coupling the boundary-scan test functionality included on each of the units-under-test to the unit diagnostic control device via the diagnostics unit and communicating data between the unit diagnostic control device and the boundary-scan test functionality included on at least one unit under test in order to test at least a portion of the at least one unit under test.

A fifth aspect of the present invention provides an apparatus comprising means for communicatively coupling a unit diagnostic communication port of a diagnostics unit in a vehicle to a unit diagnostic control device in the vehicle, means for communicatively coupling at least one unit under test to the diagnostics unit, means for communicatively coupling boundary-scan test functionality included on each unit under test to the unit diagnostic communication port, means for communicatively coupling the boundary-scan test functionality included on each of the units-under-test to the unit diagnostic control device via the diagnostics unit and means for communicating data between the unit diagnostic control device and the boundary-scan test functionality included on at least one unit under test in order to test at least a portion of the at least one unit under test.

DRAWINGS

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Figure 1:
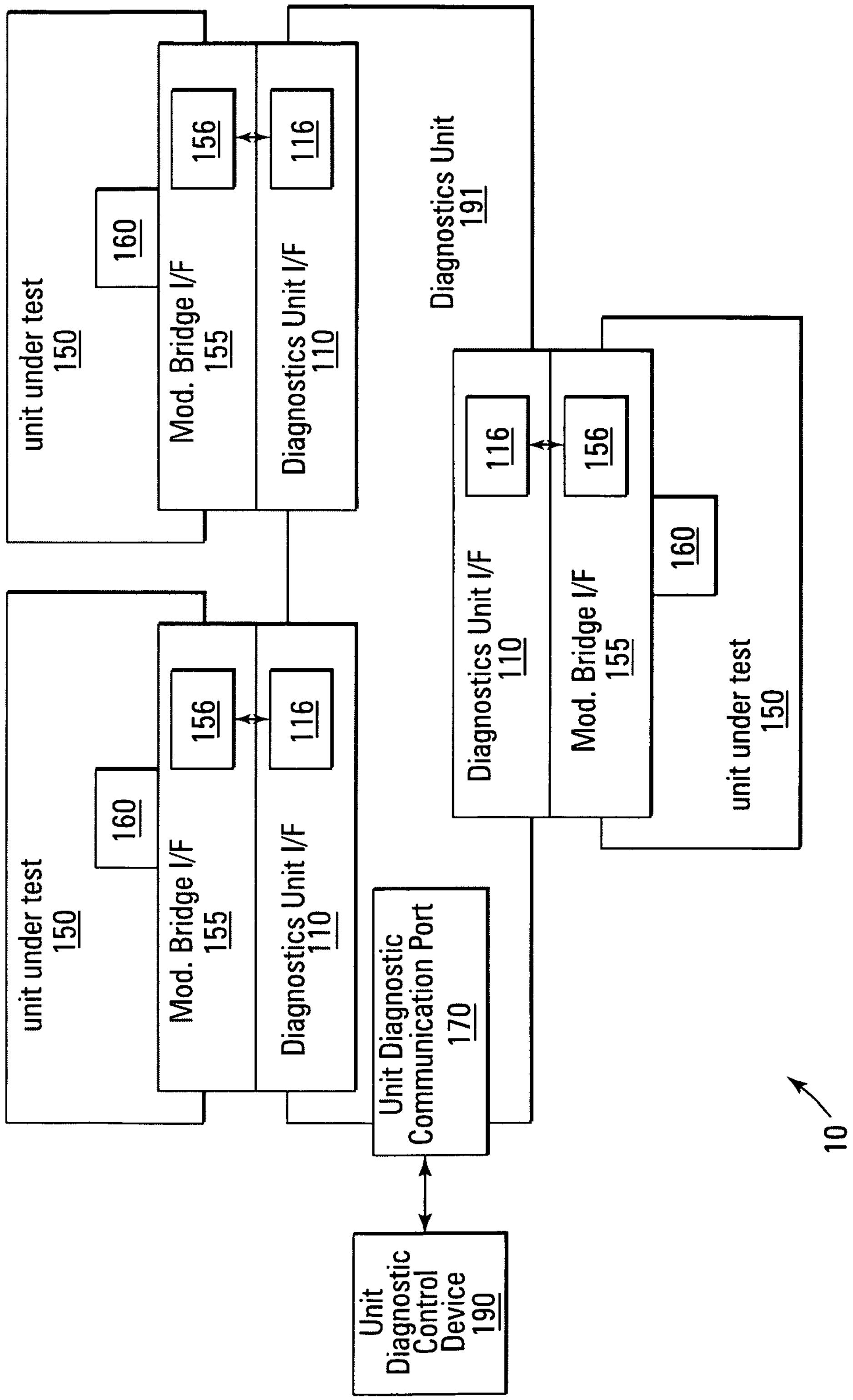
FIG. 1 is a block diagram of one embodiment of a test system to perform diagnostics on units under test.

FIG. 1 is a block diagram of one embodiment of a test system 10 to perform diagnostics on units under test 150. The test system 10 comprises a diagnostics unit 191 comprising a unit diagnostic communication port 170 and a plurality of diagnostics-unit interfaces 110 to communicatively couple the diagnostic unit 191 to a plurality of units under test 150. Each unit under test 150 comprises a module bridge interface 155 and boundary-scan test functionality 160. The module bridge interface 155 is a boundary-scan capable interface. The test system 10 additionally includes a unit diagnostic control device 190. The unit diagnostic control device 190 is communicatively coupled to the diagnostics unit 191 via the unit diagnostic communication port 170.

Each of the diagnostics-unit interfaces 110 includes a bridge 116 to selectively communicate signals between the unit diagnostic communication port 170 and any unit under test 150 that is communicatively coupled to the diagnostics unit 191. The module bridge interface 155 of each of the plurality of units under test 150 comprises a bridge 156 to selectively communicate signals from the diagnostics unit 191 to the boundary-scan test functionality 160 of the respective unit under test 150. More than one diagnostics unit 191 can be communicatively coupled to the unit diagnostic control device 190. In one implementation of this embodiment, the diagnostics unit 191 is a non-critical diagnostics unit.

The diagnostics unit 191 has the capability to initiate boundary-scan tests. In one implementation of this embodiment, the unit diagnostic control device 190 controls the diagnostics unit 191 to initiate a boundary-scan test. In another implementation of this embodiment, the diagnostics unit 191 autonomously initiates a boundary-scan test.

Figure 2:
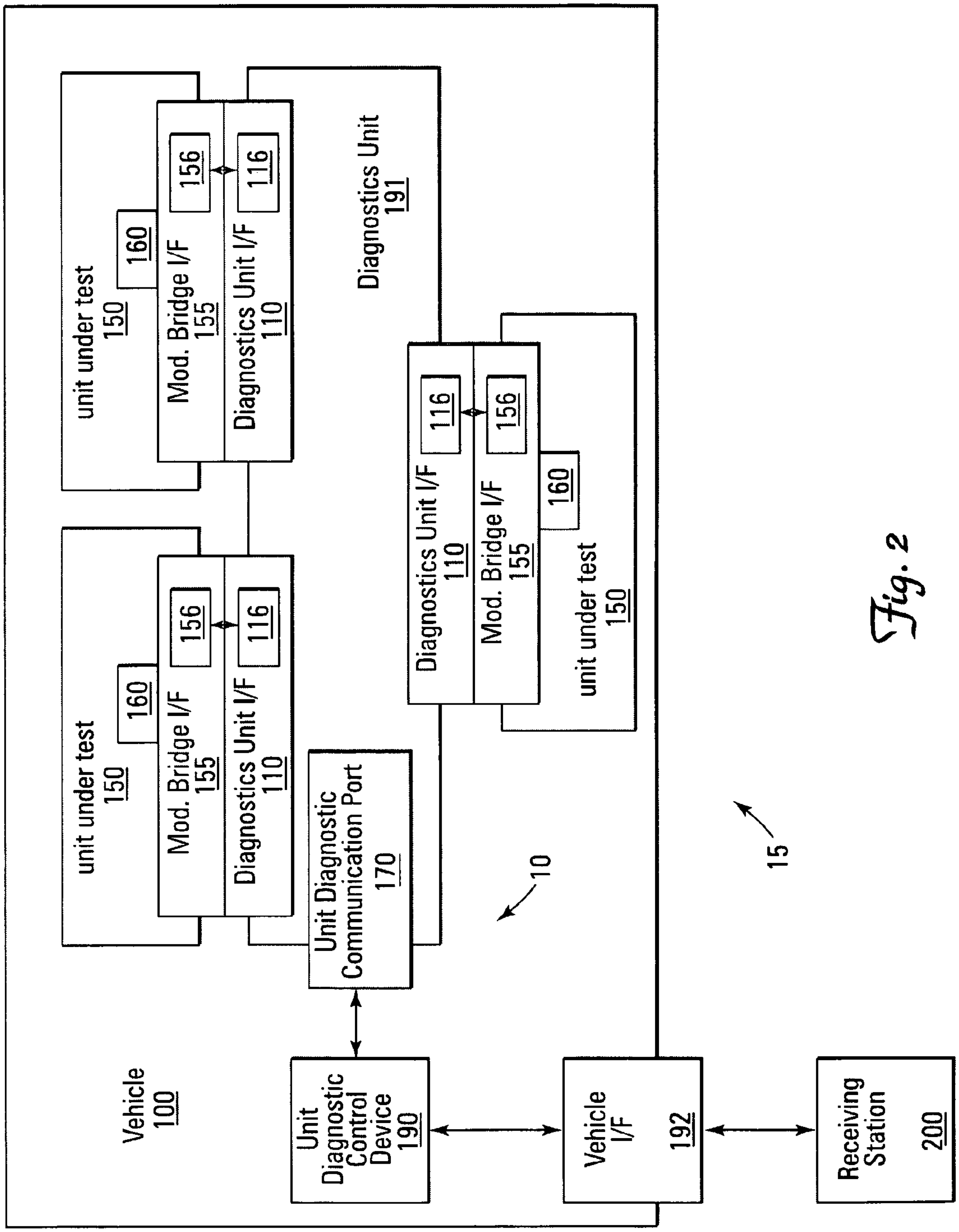
FIG. 2 is a block diagram of one embodiment of a vehicular test system to perform diagnostics on units under test located in a vehicle.

FIG. 2 is a block diagram of one embodiment of a vehicular test system 15 to perform diagnostics on units under test 150 located in a vehicle 100. The vehicular test system 15 comprises a vehicle 100, a test system enclosed within the vehicle 100 and a receiving station 200 external to the vehicle 100. As shown in FIG. 2, the test system enclosed within the vehicle 100 is the test system 10 described above with reference to FIG. 1. Test system 10 is able to perform diagnostics on units under test 150 including the diagnostics unit 191, which is located in a vehicle 100. The test system 10 is communicatively coupled to the receiving station 200. Specifically, the unit diagnostic control device 190 is communicatively coupled to the receiving station 200 via the vehicle interface (I/F) 192. The receiving station 200 comprises one or more systems and/or one or more operators to monitor and/or direct the location and/or functionality of the vehicle. In one implementation of this embodiment, the receiving station 200 is operable to upload tests to the unit diagnostic control device 190 via the vehicle interface (I/F) 192 while the vehicle 110 is operational. The vehicle 100 comprises one of an airborne vehicle, a water vehicle, and a land vehicle. In one implementation of this embodiment, the vehicle 100 includes a plurality of unit diagnostic control devices 190, which are controlled by a vehicle control unit and the vehicle control unit is communicatively coupled to the receiving station 200 through an interface port such as vehicle interface 192. In one implementation of such an embodiment, one or more of the diagnostic control devices 190 is communicatively coupled to more than one diagnostics unit 191.

Figure 3:
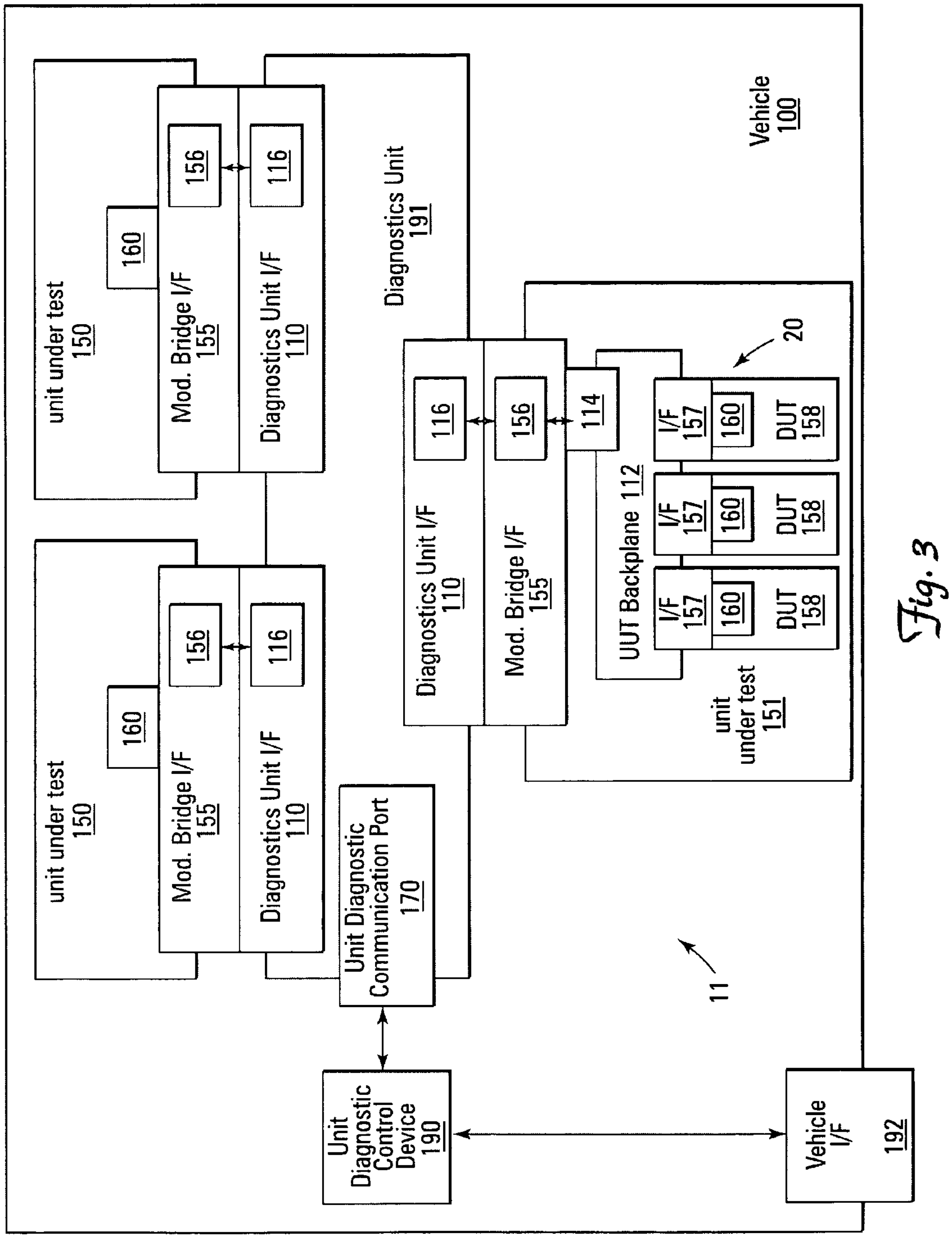
FIG. 3 is a block diagram of one embodiment of a test system to perform diagnostics on units under test in a vehicle.

FIG. 3 is a block diagram of one embodiment of a test system 11 to perform diagnostics on units under test in a vehicle 100. As shown in FIG. 3, the test system 11 includes a diagnostics unit 191 having diagnostics unit interfaces 110 as described above with reference to FIG. 1. The diagnostics unit 191 is communicatively coupled to units under test 150 and a unit under test 151. As shown in FIG. 3, the units under test 151 include a system 20 on a unit under test backplane 112 referred to here as UUT backplane 112. The UUT backplane 112 comprises an external test interface 114 and backplane interfaces (I/F) 157. The external test interface 114 is communicative coupled to the module bridge interface 155 and the backplane interfaces 157 are communicatively coupled to at least one device under test 158. Each device under test 158 comprises boundary-scan test functionality 160. In one implementation of this embodiment, the devices under test 158 include a plurality of devices operable as a system. The diagnostics unit interface 110 and the module bridge interfaces 155 are as described above with reference to FIG. 1. The unit diagnostic communication port 170, the unit diagnostic control device 190 and the vehicle interface 192 function as described above with reference to FIGS. 1 and 2.

Figure 4:
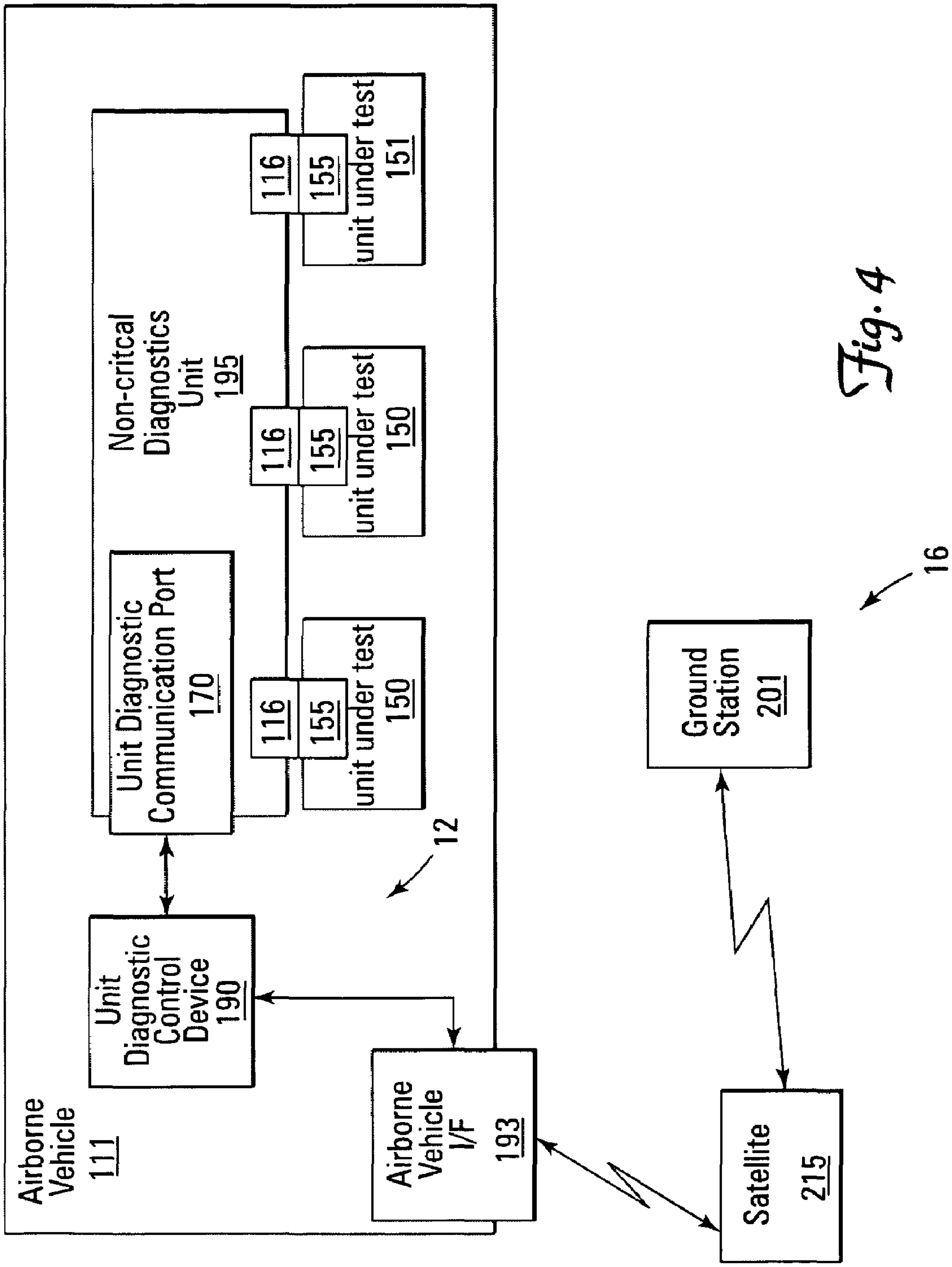
FIG. 4 is a block diagram of one embodiment of a vehicular test system to perform diagnostics on units under test located in an airborne vehicle.

FIG. 4 is a block diagram of one embodiment of a vehicular test system 16 to perform diagnostics on units under test 150 located in an airborne vehicle 111. The vehicular test system 16 comprises the airborne vehicle 111, a satellite 215, a ground station 201 and a test system 12. The airborne vehicle 111 includes an airborne vehicle interface (I/F) 193.

As shown in FIG. 4, the test system 12 includes a non-critical diagnostics unit 195 having diagnostics unit interfaces 116 and a unit diagnostic communication port 170. The non-critical diagnostics unit 195 is communicatively coupled to units under test 150 and a unit under test 151 as were described above with reference to FIGS. 2 and 3. In one implementation of this embodiment, each unit under test 150 comprises a flight box at a card level or a system level.

The non-critical diagnostics unit 195 is located in an airborne vehicle 111 and the unit diagnostic control device 190 is communicatively coupled to a ground station 201. Specifically, the unit diagnostic control device 190 is communicatively coupled to an airborne vehicle interface (I/F) 193. The airborne vehicle interface 193 is communicatively coupled to the ground station 201 via a satellite 215. The ground station 201 comprises one or more systems and/or one or more operators to monitor and/or direct the location and functionality of the airborne vehicle 111. In one implementation of this embodiment, the ground station 201 is operable to upload tests to the unit diagnostic control device 190 while the airborne vehicle 111 is operational.

In another implementation of this embodiment, there is no satellite 215 in the vehicular test system 16 and the airborne vehicle interface 193 is communicatively coupled directly to the ground station 201. In another implementation of this embodiment, the units under test 150 are critical to the operation of the airborne vehicle 11 and the diagnostics unit is a critical diagnostics unit. More than one non-critical diagnostics unit 195 can be communicatively coupled to the unit diagnostic control device 190.

Figure 5:
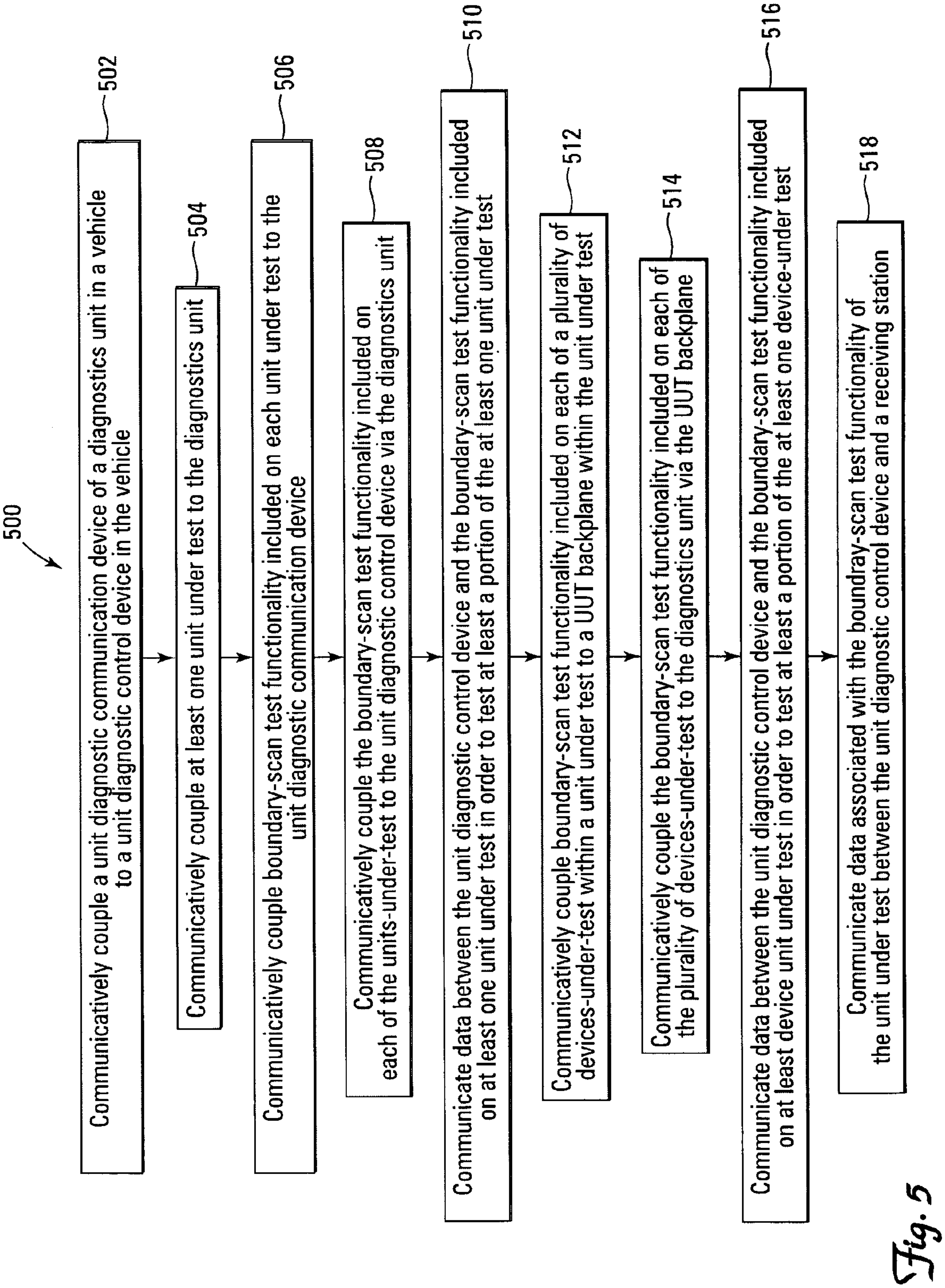
FIG. 5 shows a flow diagram of one embodiment a method to test a unit under test.

FIG. 5 shows a flow diagram of one embodiment a method 500 to test a unit under test. The method 500 is described with reference to FIGS. 2 and 3 and is operating with vehicular test system 15 of FIG. 2. The method 500 is also applicable to the vehicular test system 12 operating with vehicular test system 16 of FIG. 4. In one implementation of such an embodiment, at least a portion of the processing of method 500 is implemented in software that is executed by the external test device 190. For example, in one such implementation, the external test device 190 comprises a programmable processor (not shown) that executes appropriate program instructions (for example, program instructions that are embodied on or in a suitable storage medium from which such program instructions are read for execution by the programmable processor of the external device 190).

In another implementation of such an embodiment, at least a portion of the processing of method 500 is implemented in software that is executed by the external test device 190 and the receiving station 200. For example, in one such implementation, the external test device 190 and the receiving station 200 comprise a programmable processor (not shown) that executes appropriate program instructions (for example, program instructions that are embodied on or in a suitable storage medium from which such program instructions are read for execution by the programmable processor of the external device 190 and the receiving station 200).

At block 502, the unit diagnostic communication port 170 of a diagnostics unit 191 in a vehicle 100 is communicatively coupled to a unit diagnostic control device 190 in the vehicle 100. In one implementation of this embodiment, the communicative coupling between the unit diagnostic communication port 170 of a diagnostics unit 191 to a unit diagnostic control device 190 is provided by trace lines, lead lines, wires and the like.

At block 504, at least one unit under test 150 is communicatively coupled to the diagnostics unit 191. The module bridge interface 155 is "adapted to" mate to a particular diagnostics unit interface 110, in one implementation, by selecting a connector that is able to mate with (that is, connect to) the diagnostics unit interface 110 of such a diagnostics unit 191 (for example, by using the same type of connector as used on the respective application).

At block 506, the boundary-scan test functionality 160 included on at least one unit under test 150 (and/or unit under test 151) is communicatively coupled to the unit diagnostic communication port 170. In one implementation of this embodiment, the communicative coupling between the unit diagnostic communication port 170 of a diagnostics unit 191 to the boundary-scan test functionality 160 is provided by the bridge 156 in the module bridge interface 155 of the unit under test 150 and the bridge 116 in the diagnostics unit interface 110. Signals are sent between the bridge 116 and the unit diagnostic communication port 170 via electrical connection, electro-optical connections and wireless connections. In one implementation of this embodiment, signals are sent between the bridge 116 and the unit diagnostic communication port 170 via trace lines, lead lines, wires and the like.

In one implementation of this embodiment, the boundary-scan test functionality 160 of each physical application module 150 comprises joint test access group (JTAG) functionality and the unit diagnostic communication port 170 is a JTAG port (that is, supports the signals specified by the JTAG standards and specifications). In yet another implementation of this embodiment, the boundary-scan test functionality 160 comprises a boundary-scan bridge chip that operates according to the specification defined by the Institute of Electrical and Electronics Engineers (IEEE) 1149.1 standards, IEEE 1149.4 and/or the IEEE 1149.6 standards. In yet another implementation of this embodiment, the unit diagnostic control device 190 is a JTAG computer. In yet another implementation of this embodiment, the external test device includes test sequences (also referred to as test cases) and the "commercial off the shelf" (COTS) test software that drives the test.

At block 508, the boundary-scan test functionality 160 included on the at least one of the unit under test 150 is communicatively coupled to the unit diagnostic control device 190 via the diagnostics unit 191. When signals from the boundary-scan test functionality 160 are received at the unit diagnostic communication port 170 of the diagnostics unit 191, the signals communicated between the unit diagnostic communication port 170 and the unit diagnostic control device 190 are sent via electrical connection, electro-optical connections and wireless connections. In one implementation of this embodiment, the signals communicated between the unit diagnostic communication port 170 and the unit diagnostic control device 190 are sent via trace lines, lead lines, wires and the like.

When the unit diagnostic control device 190 is communicatively coupled to the boundary-scan test functionality 160 included on at least one unit under test 150, data is communicated between the unit diagnostic control device 190 and the boundary-scan test functionality 160 in order to test at least a portion of the at least one unit under test 150 (block 510). In one implementation of this embodiment, the tests are implemented using joint test access group (JTAG) technologies.

At block 512, the boundary-scan test functionality 160 included on each of a plurality of devices-under-test 158 within the unit under test 151 is communicatively coupled to the UUT backplane 112 (FIG. 3) within the unit under test 151. The boundary-scan test functionality 160 is communicatively coupled to the backplane interfaces (I/F) 157 of the UUT backplane 112 via trace lines, lead lines, wires and the like. The backplane interfaces (I/F) 157 communicate signals from the boundary-scan test functionality 160 to the UUT backplane 112 via trace lines, lead lines, wires and the like.

At block 514, the boundary-scan test functionality 160 included on each of the plurality of devices under test 158 is communicatively coupled to the diagnostics unit 191 via the UUT backplane 112. The UUT backplane 112 is communicatively coupled to the module bridge interface 155 via the external test interface 114. The module bridge interface 155 is communicatively coupled to the diagnostics unit interface 110 and to the diagnostics unit 191 thereby.

When the unit diagnostic control device 190 is communicatively coupled to the boundary-scan test functionality 160 included on at least one device under test 158, data is communicated between the unit diagnostic control device 190 and the boundary-scan test functionality 160 in order to test at least a portion of the at least one device under test 158 (block 516). In one implementation of this embodiment, the tests are implemented using joint test access group (JTAG) technologies.

At block 518, the data associated with the boundary-scan test functionality 160 of the unit under test 150 and/or 151 is communicated between the unit diagnostic control device 190 and a receiving station 200. In one implementation of this embodiment, the communication is, at least in part, a wireless communication. In one implementation of this embodiment, the data associated with the boundary-scan test functionality 160 of the unit under test 150 is communicated from the unit diagnostic control device 190 to the vehicle interface 192 via trace lines, lead lines, wires and the like. The data is then wirelessly communicated from the vehicle interface 192 to the receiving station. In this case, the vehicle interface 192 and the receiving station 200 each include a transceiver (not shown). The transceiver in the vehicle interface 192 and the transceiver in the receiving station 200 are compatible to transmit and receive data to each other.

In another implementation of this embodiment, the data associated with the boundary-scan test functionality 160 of the unit under test 150 and/or 151 is communicated directly from the unit diagnostic control device 190 to the receiving station 200. In this case, the unit diagnostic control device 190 and a receiving station 200 each include a transceiver (not shown). The transceiver in the unit diagnostic control device 190 and the transceiver in the receiving station 200 are compatible to transmit and receive data to each other.

In one implementation of this embodiment, the units under test 150 comprise devices, such as sensors, used to continuously or periodically send environmental data from the remote location (such as outer space or under the oceans) to the receiving station 200. In this case, if one of the units under test 150 and/or 151 fails, the unit diagnostic control device 190 sends signals indicative of a problem with one or more of the units under test 150 and/or 151 to the receiving station 200 and initiates a diagnostic scan on the units under test 150 and/or 151. The results of the diagnostic scan for the failed unit under test 150 is sent to the receiving station 200 along with the environmental data collected by the fully functional units under test 150. In this exemplary case, a system within the vehicle 100 becomes a unit under test only after the system fails. In this exemplary case, the diagnostics unit 191 is a non-flight-critical diagnostics unit 191. Each unit under test 150 is a flight box at one of a card level or a system level.

In another implementation of this embodiment, the units under test 150 comprise devices that are being used to determine the effects of the remote environment on the units under test 150. In an exemplary case, the vehicle is a space vehicle that is orbiting beyond the earth's atmosphere and the units under test 150 are monitored to determine the effects of stress on the units under test 150 from the extremely low temperature in outer space and from the cosmic radiation exposure in outer space. In this exemplary case, the diagnostics unit 191 is a non-flight-critical diagnostics unit 191. If all or a portion of the units under test 150 fail, the operators in the receiving station 200 perform a failure analysis on the failed unit under test 150 via the diagnostics unit 191. The unit diagnostic control device 190 sends signals indicative of a problem to the receiving station 200 and initiates a diagnostic scan on the units under test 150. In this exemplary case, the card or system within the vehicle 100 is a unit under test at all times. In one implementation of this embodiment, the unit diagnostic control device 190 initiates a diagnostic scan on the units under test 150 and sends the test results to the receiving station 200 indicating the point of failure in the unit under test after the testing is concluded. In another implementation of this embodiment, the unit diagnostic control device 190 sends signals indicative of a problem to the receiving station 200, initiates a diagnostic scan on the units under test 150 and sends the test results to the receiving station 200 indicating the point of failure in the unit under test after the testing is concluded.

In yet another implementation of this embodiment, the units under test 150 include the functional operating systems within the vehicle 100 that perform normal operations for the functioning of the vehicle 100 under the control of the unit diagnostic control device 190. If a problem occurs with one of the operating systems within the vehicle 100, the unit diagnostic control device 190 initiates a diagnostic scan on the operating systems within the vehicle 100. The operating systems within the vehicle 100 are now the units under test 150. In one embodiment, the unit diagnostic control device 190 sends a signal indicative of the problem to the receiving station 200 when the unit diagnostic control device 190 initiates a diagnostic scan on the operating systems within the vehicle. In this exemplary case, a system within the vehicle 100 becomes a unit under test only after the system fails.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A test system comprising:

a diagnostics unit comprising a plurality of diagnostics-unit interfaces to communicatively couple the diagnostic unit to a plurality of units under test, each unit under test comprising a module bridge interface and boundary-scan test functionality; and a unit diagnostic communication port via which a unit diagnostic control device is communicatively coupled to the diagnostics unit;

wherein when the module bridge interface of each of the units under test is communicatively coupled to a respective one of the plurality of the diagnostics unit interfaces, the boundary-scan test functionality of the respective unit under test is communicatively coupled to the unit diagnostic communication port in order to communicate with the unit diagnostic control device when the unit diagnostic control device is communicatively coupled to the diagnostics unit.

2. The test system of claim 1, wherein the diagnostics unit is located in an airborne vehicle and wherein the unit diagnostic control device is communicatively coupled to a ground station.

3. The test system of claim 1, wherein the diagnostics unit is located in a vehicle and wherein the unit diagnostic control device is communicatively coupled to a receiving station.

4. The test system of claim 1, wherein the boundary-scan test functionality comprises joint test access group (JTAG) functionality and the unit diagnostic communication port comprises a JTAG test access port.

5. The test system of claim 1, wherein each of the diagnostics-unit interfaces includes a bridge to selectively communicate signals between the unit diagnostic communication port and any unit under test that is communicatively coupled to the diagnostics unit.

6. The test system of claim 1, wherein the module bridge interface of each of the plurality of units under test comprises a bridge operable to selectively communicate signals from the diagnostics unit to the boundary-scan test functionality of the respective unit under test.

7. The test system of claim 1, wherein at least one of the units under test further comprises:

a unit under test backplane comprising an external test interface and backplane interfaces, wherein the external test interface is communicatively coupled to the module bridge interface, and wherein the backplane interfaces are communicatively coupled to at least one device under test that comprises the boundary-scan test functionality.

8. The system of claim 7, wherein the module bridge interface of each of the plurality of units under test comprises a bridge operable to selectively communicate signals from the diagnostics unit to the boundary-scan test functionality of the respective device under test.

9. The system of claim 7, wherein each of the plurality of diagnostics unit interfaces comprises a bridge to selectively communicate signals between the unit diagnostic communication port and any device under test that is communicatively coupled to the unit under test backplane.

10. The system of claim 7, wherein each of the plurality of module bridge interfaces comprises a bridge to selectively communicate signals via the external test interface to the boundary-scan test functionality of the respective device under test.

11. A vehicular test system comprising:

a vehicle;

a test system enclosed within the vehicle; and a receiving station external to the vehicle, wherein the test system is communicatively coupled to the receiving station via a unit diagnostic control device;

wherein the test system comprises:

a diagnostics unit including a plurality of diagnostics unit interfaces to communicatively couple the diagnostics unit to the plurality of units under test, each unit under test comprising a module bridge interface and boundary-scan test functionality; and a unit diagnostic communication port via which a unit diagnostic control device is communicatively coupled to the diagnostics unit;

wherein when the module bridge interface of each of the units under test is communicatively coupled to a respective one of the plurality of the diagnostics unit interfaces, the boundary-scan test functionality of the respective unit under test is communicatively coupled to the unit diagnostic control device via the unit diagnostic communication port, when the unit diagnostic control device is communicatively coupled to the unit diagnostic communication port unit.

12. The vehicular test system of claim 11, wherein the vehicle comprises one of an airborne vehicle, a water vehicle, and a land vehicle.

13. The vehicular test system of claim 12, wherein the vehicle is an airborne vehicle, wherein the diagnostics unit is a non-flight-critical diagnostics unit, wherein each unit under test is a flight box at one of a card level or a system level and wherein the receiving station is a ground station operable to upload tests to the unit diagnostic control device while the airborne vehicle is operational.

14. A method comprising:

communicatively coupling a unit diagnostic communication port of a diagnostics unit in a vehicle to a unit diagnostic control device in the vehicle;

communicatively coupling boundary-scan test functionality included on at least one unit under test to the unit diagnostic communication port;

communicatively coupling the boundary-scan test functionality included on the at least one unit under test to the unit diagnostic control device via the diagnostics unit; and communicating data between the unit diagnostic control device and the boundary-scan test functionality included on the at least one unit under test in order to test at least a portion of the at least one unit under test.

15. The method of claim 14, further comprising:

communicatively coupling boundary-scan test functionality included on each of a plurality of devices-under-test within each of the at least one unit under test to a unit under test backplane within the unit under test;

communicatively coupling the boundary-scan test functionality included on each of the plurality of devices-under-test to the diagnostics unit via the unit under test backplane; and communicating data between the unit diagnostic control device and the boundary-scan test functionality included on at least one of the devices-under-test in order to test at least a portion of the at least one of the devices-under-test.

16. The method of claim 14, further comprising:

communicating data associated with the boundary-scan test functionality of the at least one unit under test between the unit diagnostic control device and a receiving station.

17. The method of claim 14, wherein the vehicle is one of an airborne, a water vehicle and a land vehicle.

18. A method comprising:

communicatively coupling a unit diagnostic communication port of a non-critical diagnostics unit in an airborne vehicle to a unit diagnostic control device in the airborne vehicle;

communicatively coupling at least one unit under test to the diagnostics unit;

communicatively coupling boundary-scan test functionality included on each of the at least one unit under test to the unit diagnostic communication port;

communicatively coupling the boundary-scan test functionality included on each of the at least one unit-under-test to the unit diagnostic control device via the diagnostics unit; and communicating data between the unit diagnostic control device and the boundary-scan test functionality included on the at least one unit under test in order to test at least a portion of the at least one unit under test.

19. The method of claim 18, further comprising:

communicatively coupling boundary-scan test functionality included on each of a plurality of devices-under-test within each of the at least one of unit under test to a unit under test backplane within the unit under test;

communicatively coupling the boundary-scan test functionality included on each of the plurality of devices-under-test to the diagnostics unit via the unit under test backplane; and communicating data between the unit diagnostic control device and the boundary-scan test functionality included on at least one of the devices-under-test in order to test at least a portion of the at least one of the devices-under-test.

20. The method of claim 18, further comprising:

communicating data associated with the boundary-scan test functionality of the at least one unit under test between the unit diagnostic control device and a ground station.

21. Apparatus comprising:

means for communicatively coupling a unit diagnostic communication port of a diagnostics unit in a vehicle to a unit diagnostic control device in the vehicle;

means for communicatively coupling at least one unit under test to the diagnostics unit;

means for communicatively coupling boundary-scan test functionality included on each of the at least one unit under test to the unit diagnostic communication port;

means for communicatively coupling the boundary-scan test functionality included on each of the at least one unit-under-test to the unit diagnostic control device via the diagnostics unit; and means for communicating data between the unit diagnostic control device and the boundary-scan test functionality included on the at least one unit under test in order to test at least a portion of the at least one unit under test.

22. The apparatus of claim 21, further comprising:

means for communicatively coupling boundary-scan test functionality included on each of a plurality of devices-under-test within each of the at least one unit under test to a unit under test backplane within the unit under test;

means for communicatively coupling the boundary-scan test functionality included on each of the plurality of devices-under-test to the diagnostics unit via the unit under test backplane; and means for communicating data between the unit diagnostic control device and the boundary-scan test functionality included on at least one of the devices-under-test in order to test at least a portion of the at least one of the devices-under-test.

* * * * *